United States Patent [19]
Satoh

[11] Patent Number: 6,006,298
[45] Date of Patent: *Dec. 21, 1999

[54] ON-LINE MODULE REPLACEMENT SYSTEM

[75] Inventor: Tatsuo Satoh, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/621,192

[22] Filed: Mar. 21, 1996

[30] Foreign Application Priority Data

Mar. 24, 1995 [JP] Japan .................................. 7-065604

[51] Int. Cl.⁶ .................................................. G06F 13/00
[52] U.S. Cl. ......................... 710/103; 712/1; 713/103; 361/816; 307/147; 604/317
[58] Field of Search ................................ 395/283, 500, 395/325; 307/147, 43, 137, 150; 361/58, 791, 816, 424, 514

[56] References Cited

U.S. PATENT DOCUMENTS

| | | | |
|---|---|---|---|
| 4,079,440 | 3/1978 | Ohnuma et al. | 361/424 |
| 4,654,829 | 3/1987 | Jiang et al. | 365/229 |
| 4,840,570 | 6/1989 | Mann, Jr. et al. | 439/74 |
| 4,955,020 | 9/1990 | Stone et al. | 370/85.9 |
| 4,999,787 | 3/1991 | McNally et al. | 364/514 |
| 5,028,809 | 7/1991 | Watanabe et al. | 307/137 |
| 5,247,619 | 9/1993 | Mutoh et al. | 395/325 |
| 5,272,584 | 12/1993 | Austruy et al. | 361/58 |
| 5,293,636 | 3/1994 | Bunton et al. | 395/800 |
| 5,384,492 | 1/1995 | Carlson et al. | 307/149 |
| 5,514,894 | 5/1996 | Fukuhara | 257/360 |
| 5,530,810 | 6/1996 | Bowman | 395/283 |
| 5,587,685 | 12/1996 | Johansson | 327/546 |
| 5,613,130 | 3/1997 | Teng et al. | 395/750 |
| 5,726,506 | 3/1998 | Wood | 307/147 |
| 5,767,999 | 6/1998 | Kayner | 359/163 |
| 5,909,584 | 6/1999 | Tavallaei et al. | 713/300 |

FOREIGN PATENT DOCUMENTS 51-108520  9/1976  Japan .

OTHER PUBLICATIONS

PCI Local Bus (Specification—Rev. 2.1) by Special Interest Group (see p. 8, sec. 2.2; p. 11,sec. 2.2.4; p. 15, sec. 2.2.8), Jun. 1995.

*Primary Examiner*—Glenn A. Auve
*Assistant Examiner*—Eric S. Thlang
*Attorney, Agent, or Firm*—Sughrue, Mion, Zinn, Macpeak & Seas, PLLC

[57] ABSTRACT

In an electronic apparatus having a plurality of printed boards or modules, an on-line module replacement system for allowing the desired of the boards to be inserted or removed while maintaining connecting lines alive allows a plug-in package to be mounted to a backboard without affecting the power supply voltage of other packages. This can be done without resorting to an inductance or similar impedance part heretofore included in a plug-in package.

4 Claims, 5 Drawing Sheets

Fig. 5
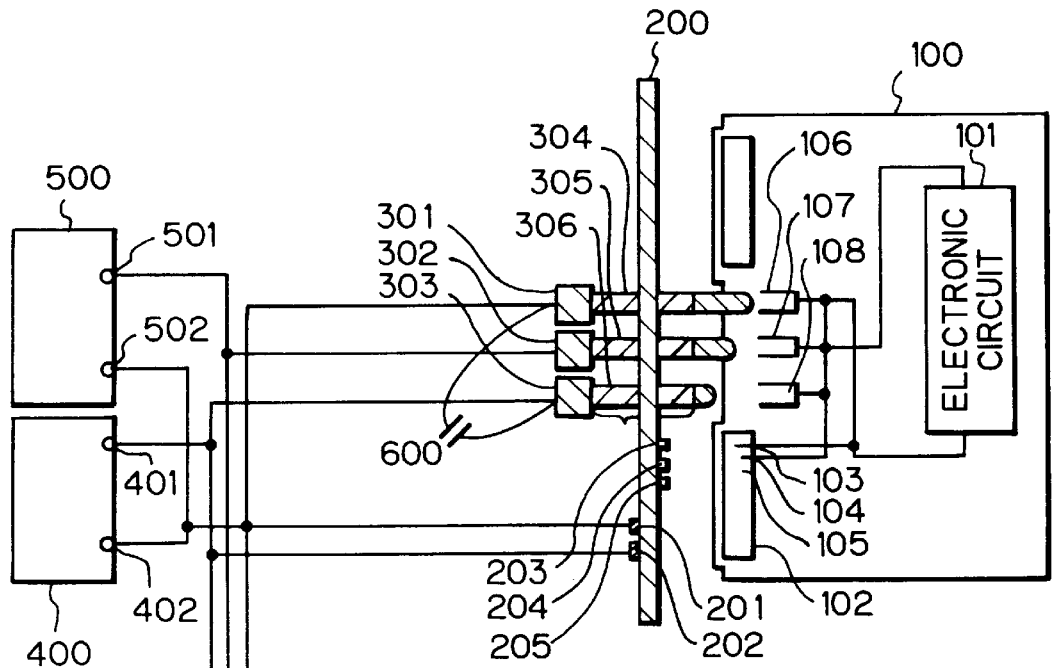
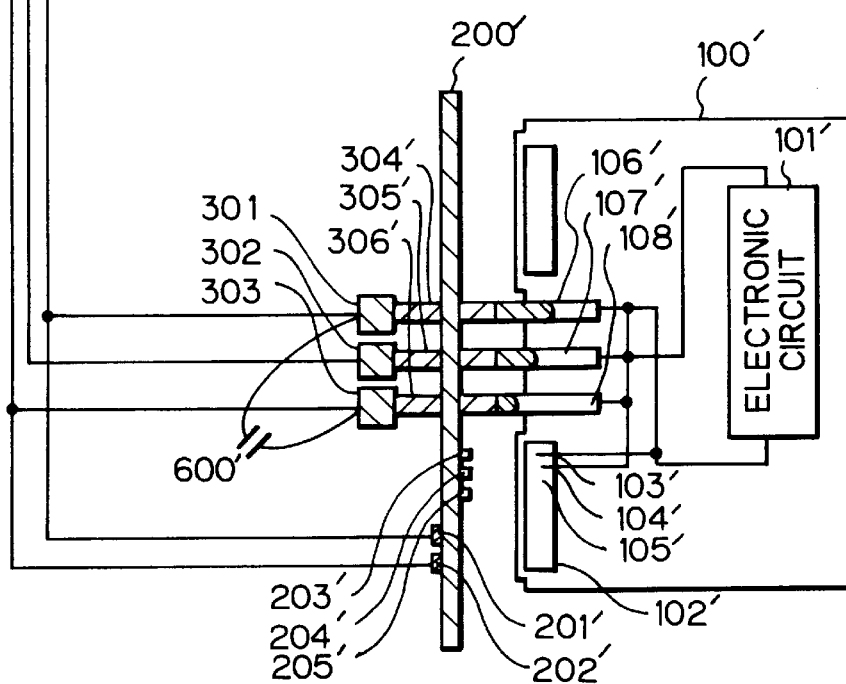

ON-LINE MODULE REPLACEMENT SYSTEM

BACKGROUND OF THE INVENTION

The present invention relates to an electronic apparatus having a plurality of printed boards or modules and, more particularly, to a system for allowing the desired one of the modules to be mounted or dismounted to or from the apparatus while maintaining connecting lines alive.

Japanese Patent Laid-Open Publication No. 51-108520, for example, discloses in its FIG. 3 an arrangement for protecting the power supply voltage of a plug-in package from noticeable variation by use of the system of the kind described. In this arrangement, a current is fed from an outside power source to a plug-in package via a connector. The current is applied to an electronic circuit built in the package via an impedance and an inductance. The impedance and inductance reduce a rush current and thereby reduce the variation of the power source voltage. However, this kind of scheme is not practicable without resorting to the impedance and inductance. When the electronic circuit is of the kind consuming great power, the impedance and inductance are necessarily implemented as bulky parts which obstruct the effective mounting of the package.

SUMMARY OF THE INVENTION

It is therefore an object of the present invention to provide an on-line module replacement system enhancing the effective mounting of a plug-in package.

It is another object of the present invention to provide an on-line module replacement system which allows a minimum of variation to occur in the power source voltage of a plug-in package without resorting to an inductance or similar impedance part.

An on-line module replacement system of the present invention has a ground pin. A first power supply pin is connected to a first power supply in order to be, when a package is inserted, electrically connected to the package together with the ground pin. A second power supply pin is connected to a second power supply in order to be, when the package is inserted, electrically connected to the package after the first power supply pin has been electrically connected to the package. A backboard supports the ground pin, first power supply pin, and second power supply pin. The first power supply pin is electrically disconnected from the package after the second power supply pin has been electrically connected to the package.

BRIEF DESCRIPTION OF THE DRAWINGS

The above and other objects, features and advantages of the present invention will become more apparent from the following detailed description taken with the accompanying drawings in which:

FIG. 5 shows a modification of the embodiment shown in FIG. 4.

DESCRIPTION OF THE PREFERRED EMBODIMENTS

Figure 1:
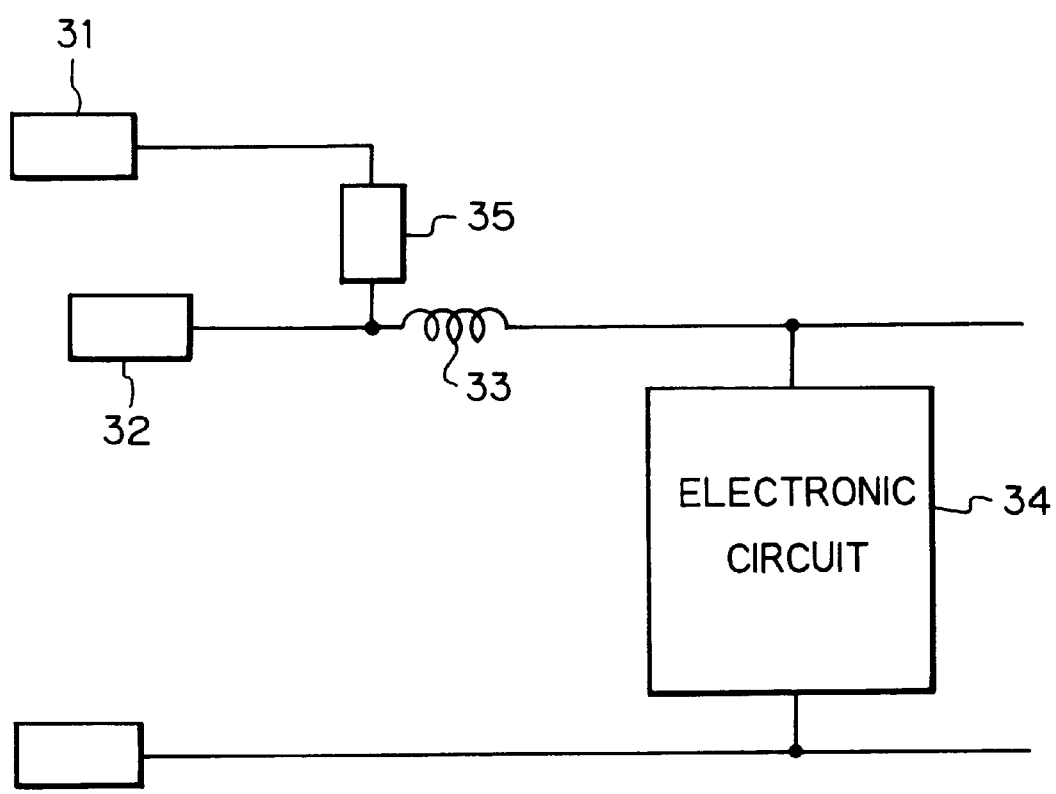
FIG. 1 is a block diagram schematically showing a conventional on-line module replacement system.

To better understand the present invention, a brief reference will be made to a conventional on-line module replacement system, shown in FIG. 1. As shown, connectors 31 and 32 are mounted on a plug-in package and different in length from each other. The connectors 31 and 32 are connected to a single power supply by a backboard at the outside of the package. A current flown into the package via the connector 32 is fed to an electronic circuit 34 via an inductance 33. The connector 31 is connected to the connector 32 by an impedance 35. To insert the package, the connector 31 longer than the connector 32 is connected to a power supply line first. As a result, a current is fed from the connector 32 to the circuit 34 via the impedance 35 and inductance 33. At this instant, a rush current is reduced by the impedance 35 and inductance 33, so that a voltage fluctuates little. Subsequently, the connector 32 is connected to the power source line with the result that the current is fed to the circuit 34 via the inductance 33. This causes a minimum of variation to occur in the power supply voltage of other plug-in packages.

However, the above conventional arrangement is not practicable without resorting to the impedance 35 and inductance 33. When the electronic circuit 34 is of the kind consuming great power, the impedance 35 and inductance 33 are necessarily implemented as bulky parts which obstruct the effective mounting of the package, as discussed earlier.

Figure 2:
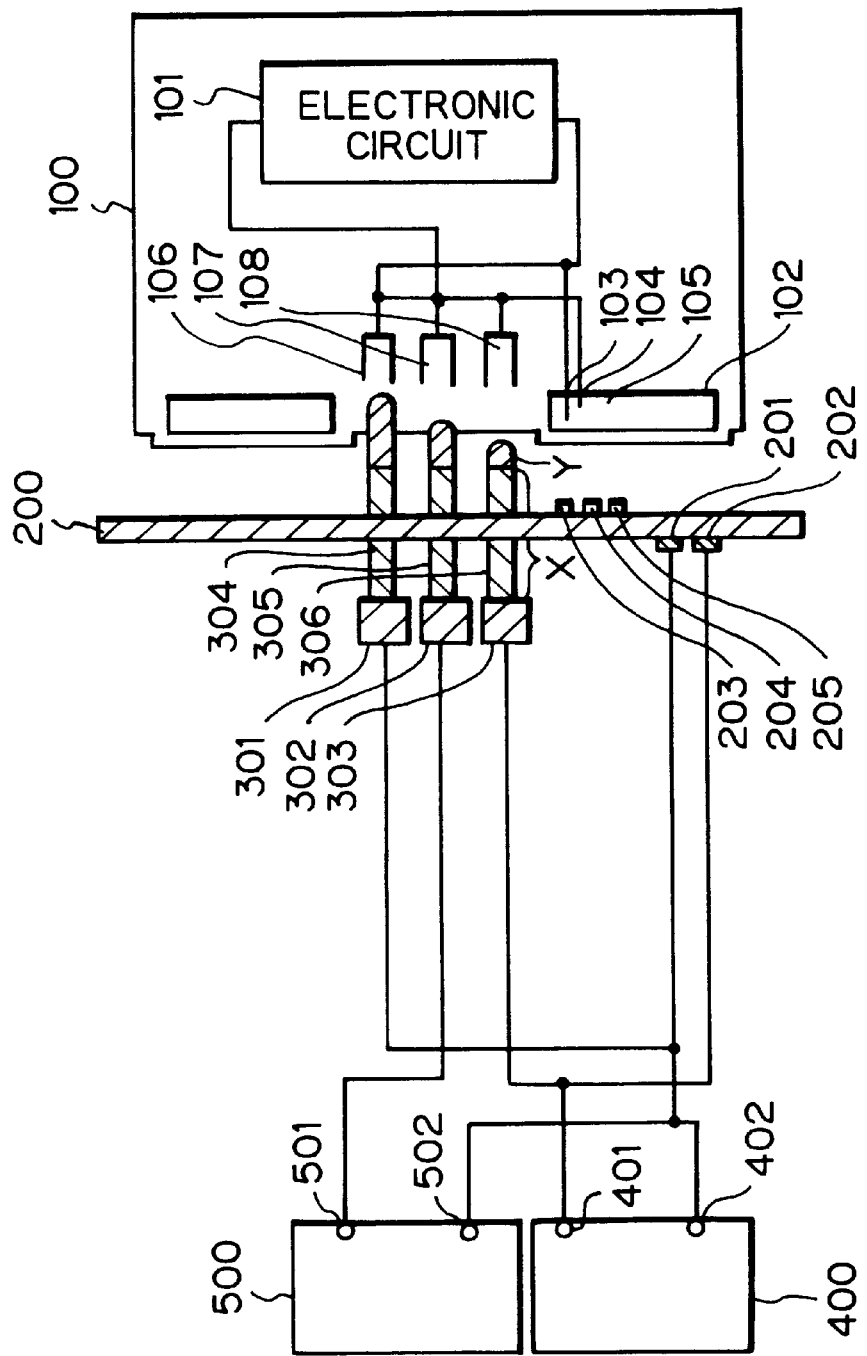
FIG. 2 shows an on-line module replacement system embodying the present invention.

Referring to FIG. 2, an on-line module replacement system embodying the present invention will be described. As shown, the system has a backboard 200 connected to power supplies 400 and 500, and a plug-in package or module 100.

The package 100 has an electronic circuit 101, contact pins 107 and 108 and a power supply pin 104 for feeding a power supply voltage to the circuit 101, a contact pin 106 and a ground pin 103, and a connector 102 having the pins 103 and 104 and a signal line 105.

The backboard 200 includes a ground terminal 201 connected to a ground layer, not shown, included in the backboard 200. A power supply terminal 202 is connected to a power supply layer, not shown, also included in the backboard 200. A pin 203 feeds the ground voltage to the ground pin 103 while a pin 204 feeds the power supply voltage to the power supply pin 104. A pin 205 feeds a signal to the signal pin 105. A pin 304 is inserted in the contact pin 106 in order to feed the ground voltage to the contact pin 106. The pin 304 is longer than the other pins, as illustrated. A pin 305 is inserted in the contact pin 107 for feeding the power supply voltage thereto. A pin 306 is inserted in the contact pin 108 for feeding the power supply voltage thereto. A ground bus line 301 is connected to the pin 304, ground terminals 402 and 502 respectively included in the power supplies 400 and 500, and the ground terminal 201. A bus line 302 is connected to the pin 305 and a power supply terminal 501 included in the power supply 500. A bus line 303 is connected to the pin 306, a power supply terminal 401 included in the power supply 400, and the power supply terminal 202. The bus line 303 consists of an insulated portion X and a conductive portion Y.

The pins 304, 305 and 306 of the backboard 200 and the pins 103, 104 and 105 of the connector 102 each has a particular length.

When the package 100 is inserted into the backboard 200, the various pins of the package are sequentially connected to the associated pins of the backboard 200, as follows. First, the contact pin 106 is connected to the pin 304, and then the contact pin 107 is connected to the pin 305. Subsequently, the contact pin 108 is connected to the pin 306, and then the ground pin 103 is connected to the pin 203. Further, the power supply pins 104 and signal pin 105 are sequentially connected to the pins 204 and 205, respectively, in this order.

When the package 100 is pulled out of the backboard 200, the pin 105 is removed form the pin 205 first. Then, the pin 104 is removed from the pin 204. Subsequently, the ground pin 103 and contact pin 108 are sequentially removed from the pins 203 and 306, respectively, in this order. Finally, the contact pins 107 and 106 are sequentially removed from the pins 305 and 304, respectively, in this order.

The pins 304, 305 and 306 each has an insulated portion extending over a preselected length from its end connected to the bus line 301, 302 or 303, and a conductive portion at its tip. Hence, when the package 100 is inserted into the backboard 200, the contact pin 108 is connected to the pin 306, and then the contact pin 107 is connected to the pin 305 by the insulated portion of the pin 305.

Figure 3:
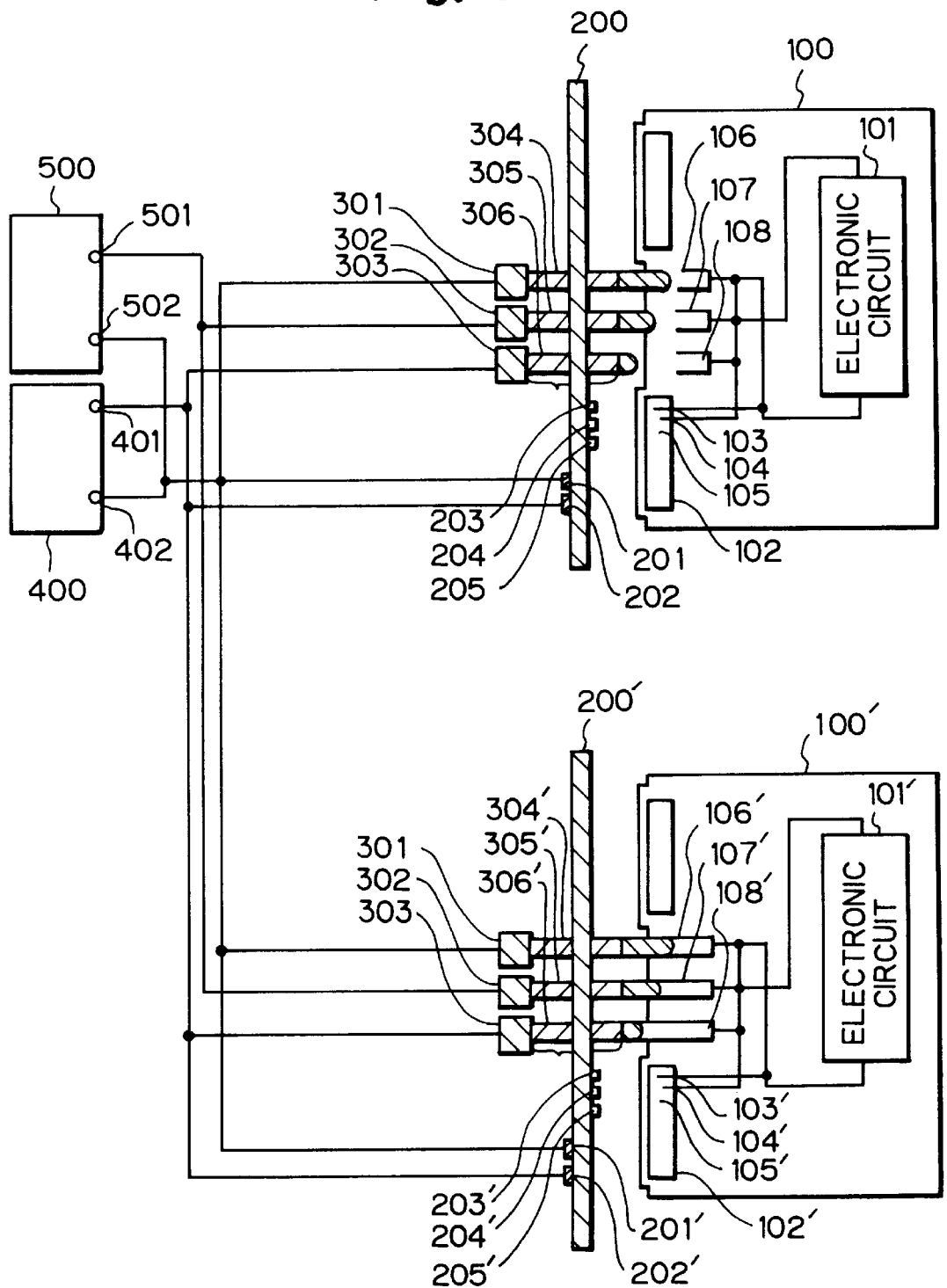
FIG. 3 shows a modification of the embodiment shown in FIG. 2.

FIG. 3 shows a modification of the above embodiment. As shown, a plug-in package 100' identical in configuration with the package 100 is connected to pins 304', 305', 306', 203', 204' and 205' provided on a backboard 200'. The package 100' is inserted and removed from the backboard 200' in the same manner as the package 100 is inserted and removed from the backboard 200. The operation of this modification is as follows.

Assume that the package 100' has already been mounted to the backboard 200' when the package 100 is to be mounted to the backboard 200. In this condition, the package 100' is not connected to the bus line 302, but it is connected to the bus line 303. When the package 100 is inserted into the backboard 200, the contact pin 106 is connected to the pin 304 first. As a result, the ground potential is applied to the package 100.

Subsequently, the contact pin 107 is connected to the pin 305 with the result that the current flows from the power supply 500 to an electronic circuit 101 included in the package 100. At this instant, although the potential of the bus line 302 noticeably varies, it does not effect the potential of the bus line 303, i.e., the potential of the bus line 303 remains stable. The potential of the other package 100' also remains stable because it is not connected to the bus line 302, as stated earlier. Because the circuit 101 has already reached a preselected potential, the potential of the bus line 303 varies little. When the pin 306 is inserted into the pin 108, the contact pin 107 is brought into contact with the insulated portion of the pin 305 and electrically disconnected thereby.

After the ground pin 103 has been connected to the pin 203, the power supply pin 104 is connected to the pin 204. Finally, the signal pin 105 is connected to the pin 205. This completes the insertion of the package 100 into the backboard 200. When the package 100 is pulled out of the backboard 200, a procedure opposite to the above procedure occurs, as follows. First, the signal pin 105 is removed from the pin 205, and then the power supply pin 104 is removed from the pin 204. Subsequently, the ground pin 103 and contact pin 108 are sequentially removed from the pins 203 and 306, respectively, in this order. At this stage of the procedure, the contact pin 107 is held in connection with the pin 305 while the package 100' is present on the backboard 200. Hence, contact pins 108' and 107' are held in connection with pins 306' and 305', respectively. In this condition, the potential of the bus line 302 is stable with the power being continuously fed to the circuit 101. Thereafter, the contact pin 107 is removed from the pin 305, and then the contact pin 106 is removed from the pin 304.

In the embodiment and its modification described above, particular relations are assigned to the contact pin 106 and pin 304 and the contact pin 107 and pin 305 as to electrical connection. Such relations may be inverted, if desired.

In the illustrative embodiment, when the pin 306 is inserted into the contact pin 108, the surface of the latter is not connected to the surface of the former at once, as seen in a microscopic view. That is, the pin 306 is sequentially inserted into the contact pin 108 with chattering. The chattering causes, e.g., the voltage of the bus line 303 to vary. More specifically, when the contact pin 108 and pin 306 are brought into connection and then brought out of connection, the voltage of the pin 108 is likely to sharply fall. This is because the current from the pin 305 cannot be fed to the circuit 101 via the contact pin 107 in time. At this instant, when the contact pin 108 and pin 306 are again brought into contact, the voltage of the pin 306 is likely to vary.

Figure 4:
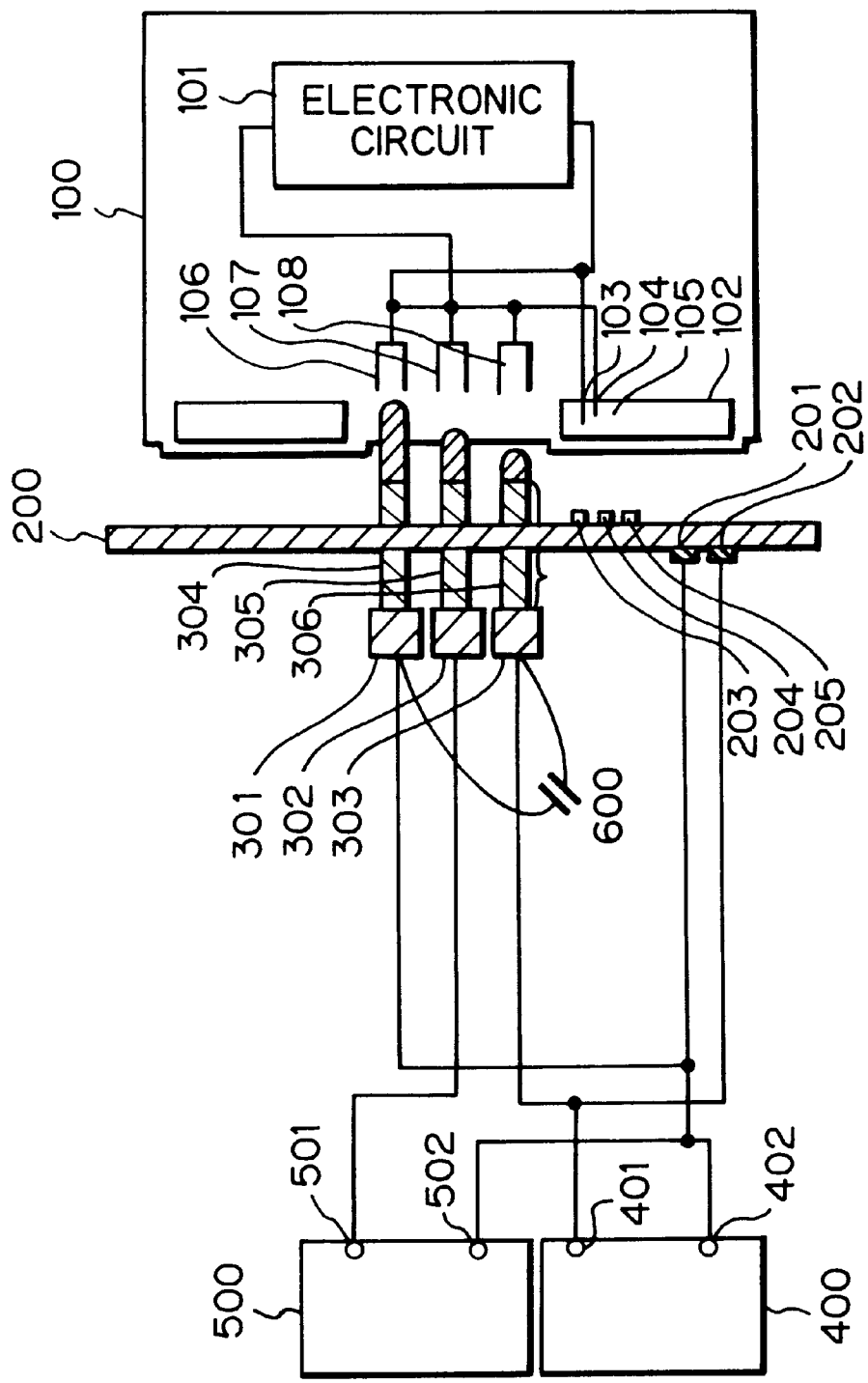
FIG. 4 shows an alternative embodiment of the present invention.

Referring to FIG. 4, an alternative embodiment of the present is shown which solves the above problem. As shown, this embodiment is characterized in that a capacitor 600 is connected to the ground bus line 301 and bus line 303 which are connected to the pins 304 and 306, respectively. The capacitor 600 is charged by the power supply 400. Hence, even when chattering occurs during the course of insertion of the pin 306 into the contact pin 108, the charge of the capacitor 600 prevents the voltage from sharply falling. As a result, the capacitor 600 serves to reduce the variation of voltage.

Likewise, in the modification shown in FIG. 3, when the pin 306 is inserted into the contact pin 108, the latter is sequentially inserted into the former with chattering. The chattering causes the voltage of the bus line 303 to vary. More specifically, when the contact pin 108 and pin 306 are brought into connection and then brought out of connection, the voltage of the pin 108 is likely to sharply fall. This is because the current from the pin 305 cannot be rapidly fed to the circuit 101 via the contact pin 107. At this instant, when the contact pin 108 and pin 306 are again brought into contact, the voltage of the pin 306 is likely to vary. Moreover, the voltage of the other package 100' is apt to vary.

FIG. 5 shows a modification of the embodiment shown in FIG. 4 and capable of eliminating the above problem. As shown, the capacitor 600 is connected to the ground bus line 301 and bus line 303 which are connected to the pins 304 and 306, respectively. In addition, a capacitor 600' is connected to the ground bus line 301 and bus line 303 which are connected to the pins 304' and 306'. It is to be noted that if the distance between the group of pins 304–306 and the group of pins 304'–306' is short, then only one of the capacitors 600 and 600' will suffice.

In the above modification, the capacitors 600 and 600' are both charged by the power supply 400. Hence, when the package 100 or 100' is mounted to the backboard 200 or 200', the charge of the capacitor 600 or 600' prevents the voltage from sharply falling.

In summary, in accordance with the present invention, a plug-in package can be mounted to a backboard without effecting the power supply voltage of other packages. This can be done without resorting to an inductance or similar impedance part heretofore included in a plug-in package.

Various modifications will become possible for those skilled in the art after receiving the teachings of the present disclosure without departing from the scope thereof.

What is claimed is:

1. An on-line module replacement system, comprising:

a backboard connectable to a plug-in module;

a ground pin;

a first power supply pin connected to a first power supply, said first power supply pin being electrically connected to said plug-in module together with said ground pin when said plug-in module is inserted into said backboard;

a second power supply pin connected to a second power supply, said second power supply pin being electrically connected to said plug-in module after said first power supply pin has been electrically connected to said plug-in module when said plug-in module is inserted into said backboard; and a capacitor connected between said ground pin and said second power supply pin;

said ground pin, said first power supply pin, and said second power supply pin being supported by said backboard and providing a connection between said backboard and contact pins of said plug-in module;

said first power supply pin comprising an insulated portion which is connected to said plug-in module after said second power supply pin has been electrically connected to said plug-in module such that said first power supply pin is mechanically connected but electrically disconnected from said plug-in module after said second power supply pin has been electrically connected to said plug-in module, wherein said first power supply pin has a greater length than said second power supply pin.

2. The on-line module replacement system as claimed in claim 1, wherein said ground pin is connectable to a first contact pin of said plug-in module, said first power supply pin is connectable to a second contact pin of said plug-in module, and said second power supply pin is connectable to a third contact pin of said plug-in module.

3. An on-line module replacement system comprising:

a backboard connectable to a plug-in module;

a ground pin;

a first power supply pin connected to a first power supply, said first power supply pin being electrically connected to said plug-in module together with said ground pin when said plug-in module is inserted into said backboard;

a second power supply pin connected to a second power supply, said second power supply pin being electrically connected to said plug-in module after said first power supply pin has been electrically connected to said plug-in module when said plug-in module is inserted into said backboard; and a capacitor connected between said ground pin and said second power supply pin;

said ground pin, said first power supply pin, and said second power supply pin being supported by said backboard and providing a connection between said backboard and contact pins of said plug-in module, said first power supply pin comprising an insulated portion which is connected to said plug-in module after said second power supply pin has been electrically connected to said plug-in module such that said first power supply pin is mechanically connected but electrically disconnected from said plug-in module after said second power supply pin has been electrically connected to said plug-in module.

4. The on-line module replacement system as claimed in claim 3, wherein said ground pin is connectable to a first contact pin of said plug-in module, said first power supply pin is connectable to a second contact pin of said plug-in module, and said second power supply pin is connectable to a third contact pin of said plug-in module.

* * * * *